United States Patent [19]

Sim

[11] Patent Number: 5,638,324
[45] Date of Patent: Jun. 10, 1997

[54] FLASH MEMORY DEVICE

[75] Inventor: Hyun S. Sim, Sungnam, Rep. of Korea

[73] Assignee: Hyundai Electronics Industries Co., Ltd., Kyungki-do, Rep. of Korea

[21] Appl. No.: 576,056

[22] Filed: Dec. 21, 1995

[30]     Foreign Application Priority Data

Dec. 27, 1994 [KR] Rep. of Korea .................. 94-37293

[51] Int. Cl.⁶ ............................................. G11C 11/34
[52] U.S. Cl. ........................... 365/185.22; 365/185.11; 365/185.28
[58] Field of Search ............ 365/185.22, 185.28, 365/185.11

[56]              References Cited

U.S. PATENT DOCUMENTS 5,446,690  8/1995  Tanaka et al. ...................... 365/185

*Primary Examiner*—David C. Nelms
*Assistant Examiner*—F. Niranjan
*Attorney, Agent, or Firm*—Fish & Richardson, P.C.

[57]               ABSTRACT

The present invention relates to a flash memory device and pre-program only the memory cells which keep the erase state by verifying whether the memory cells are programmed before performing the pre-program operation to prevent the memory cell from being over-programmed at the time of pre-program. Accordingly, there are excellent effects in that the reliability of the device can be improved by preventing the memory cell from being over-programmed and the operation speed of the device can be improved by reducing the time required in the pre-program operation.

4 Claims, 3 Drawing Sheets

FLASH MEMORY DEVICE

BACKGROUND OF INVENTION

1. Field of the Invention

The present invention relates to a flash memory device, and particularly to a flash memory device having a program verification circuit and a pull-up circuit which enable a verification of a state of a memory cell before performing a pre-program operation.

2. Information Disclosure Statement

In general, the flash memory device such as a flash electrically erasable and programmable read only memory (EEPROM) comprises a memory cell array and peripheral circuits. The memory cell array is divided into a plurality of sectors, and in each sector a plurality of memory cells are connected in a matrix fashion between a bit line and a word line. The peripheral circuits are constructed in such a way that it programs or erases the memory cells according to signals input from external or reads data programmed in each memory cell and outputs the data to the external. Such flash memory device has functions of electrical programming and erasing, and performs a verification operation to confirm whether the memory cells are programmed or erased after operation of programming or erasing. Here, the programming operation is performed byte by byte or word by word, and the erasing operation is performed chip by chip, that is, for a total of sector or memory cell. In addition, the flash memory device performs an operation of pre-programming the memory cells to prevent an over erase of memory cells before performing the erasing operation. In a conventional flash memory device, since the pre-program operation is performed byte by byte or word by word, the pre-program operation takes long time. Furthermore, in case where the memory cells which keep the program state are reprogrammed by the pre-program operation, the reliability of the memory cells can be degraded by an over programming.

SUMMARY OF THE INVENTION

Therefore, an object of the present invention is to provide a flash memory device which can solve the above described disadvantages by having a program verification circuit and a pull-up circuit which enable the verification of the state of selected memory cells before performing the pre-program operation.

To achieve the above described object, the present invention is characterized in that it comprises a memory cell array in which a plurality of memory cells are connected in a matrix fashion between a first through mth word lines and a first through nth bit lines; a word line selection circuit for outputting each word line selection signal to each of the first through mth word lines; a pre-program verification circuit which is connected to the first through nth bit lines and which outputs a verification signal to the word line selection circuit and a program circuit according to a pre-program enable signal; and a pre-program pull-up circuit which is connected to the first through nth bit lines and which raises each of the potentials of the first through nth bit lines according to the pre-program enable signal.

The pre-program verification circuit comprises a transistor which is connected between a power source and a verification signal output terminal and which operates according to the pre-program enable signal; and a plurality of transistors which are connected in series between said verification signal output terminal and a ground and each of which operates according to the state of each of said first through nth bit lines.

The pre-program verification circuit according to another embodiment comprises a transistor which is connected between a power source and a verification signal output terminal and which operates according to the pre-program enable signal; and a plurality of transistors each of which is connected in parallel between said verification signal output terminal and said first through nth bit lines and which operate according to the pre-program enable signal.

The pre-program pull-up circuit comprises a plurality of transistors each of which is connected in parallel between the power source voltage and the first through nth bit line, and which operate according to the pre-program enable signal.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DETAILED DESCRIPTION OF THE INVENTION

A detailed description of the invention is given below with reference to the accompanying drawings.

Figure 1:
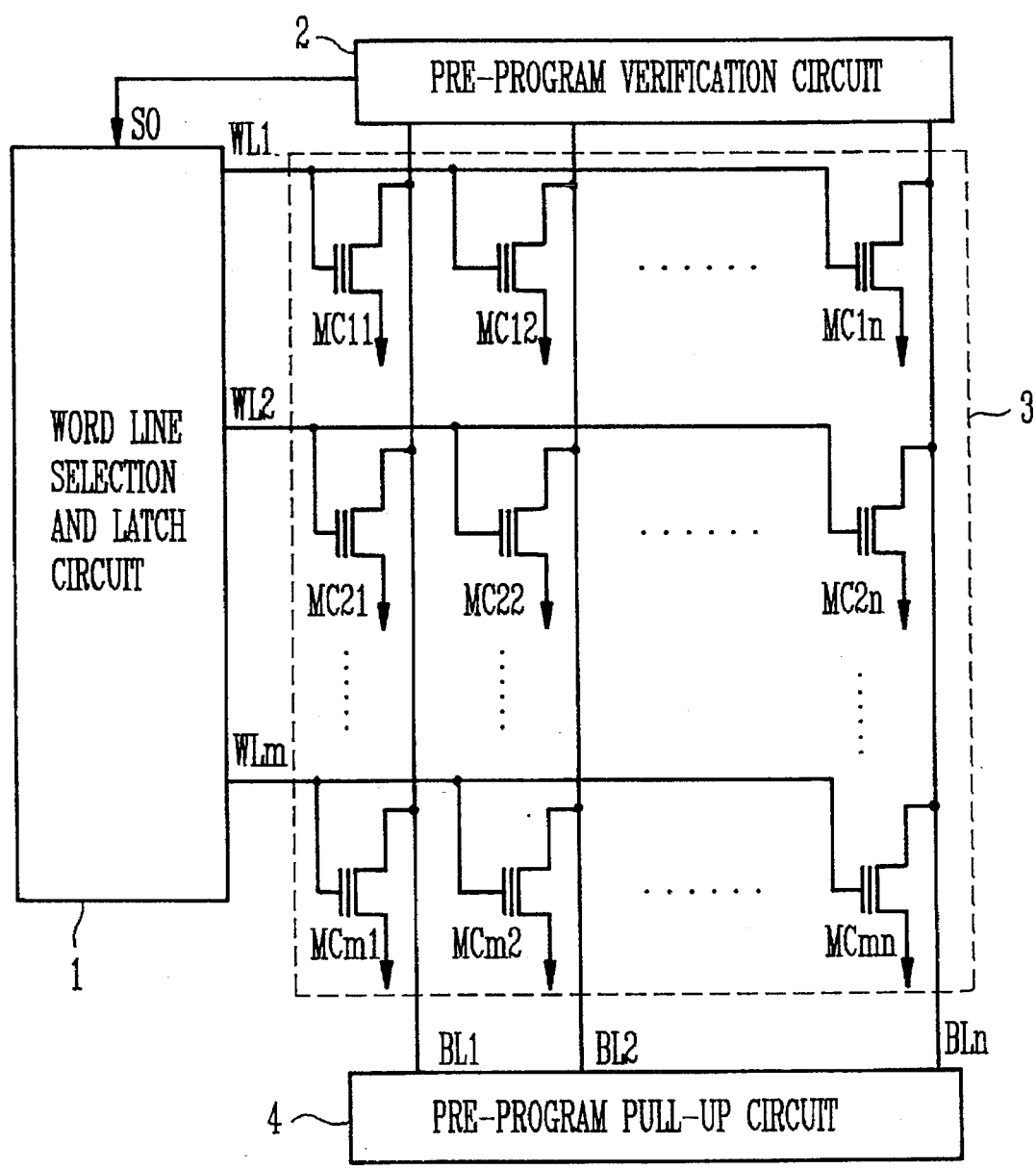
FIG. 1 is a circuit diagram of a flash memory device according to the present invention.
Figure 2:
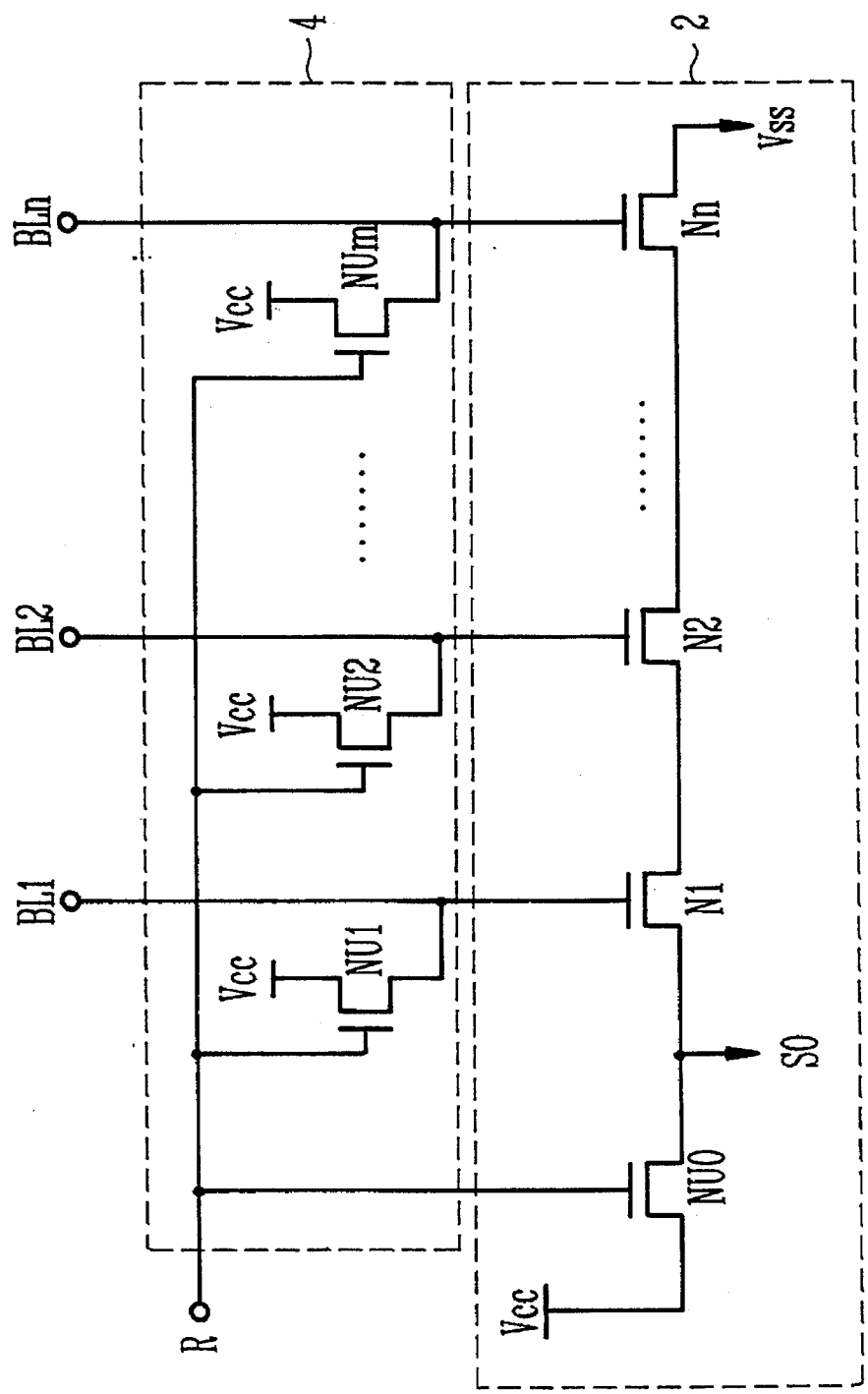
FIG. 2 is a detailed circuit diagram of a pre-program verification circuit and a pre-program pull-up circuit of FIG. 1.

FIG. 1 is a circuit diagram of a flash memory device and FIG. 2 is a detailed circuit diagram of a pre-program verification circuit and a pre-program pull-up circuit of FIG. 1.

In the flash memory device according to the present invention, as shown in FIG. 1, a plurality of memory cells MC11 through MCmn are connected in a matrix fashion between a first through mth word lines WL1 through WLm and a first through nth bit lines BL1 through BLn so as to form a memory cell array 3, and each of the first through mth word lines WL1 through WLm is connected to an output terminal of a word line selection and latch circuit 1 for outputting a word line selection signal. Also, each of the pre-program verification circuit 2 and the pre-program pull-up circuit 4 is connected to the first through nth bit lines BL1 through BLn, and the pre-program verification circuit 2 is connected to the word line selection and latch circuit 1. In the pre-program verification circuit 2, as shown in FIG. 2, a transistor NU0 operating according to a pre-program enable signal R is connected between a power source voltage VCC and an output terminal X in which a verification signal so is output, and transistors N1 through Nn operating according to a condition of each of the first through nth bit lines BL1 through BLn are connected in series between the output terminal X and a ground Vss. In a pre-program pull-up circuit, as shown in FIG. 2, transistors NU1 through NUm operating according to the pre-program enable signal R are connected in parallel between the power source VCC and the first through nth bit line BL1 through BLn, respectively.

To the flash memory device according to the present invention constructed as described above is given function of verification which can verify whether the memory cells are programmed before performing the pre-program operation to prevent the memory cells from being over-programmed at the time of pre-program. Now, the operation of verification whether the memory cells are programmed before performing the pre-program operation will be described.

To verify whether the memory cells are programmed, the pre-program enable signal R of high potential state is input to the pre-program verification circuit 2 and the pre-program pull-up circuit 4, respectively. At this time, the word line selection and latch circuit 1 supplies a word line selection signal to each word line to be pre-programmed among the first through mth word lines WL1 through WLm.(Here, it is assumed that the word line selection signal is supplied to the first through mth word lines WL1 through WLm) By the pre-program enable signal R, the transistor NU0 of the pre-program verification circuit 2 is turned on and also the transistors NU1 through NUm of the pre-program pull-up circuit 4 are turned on. The potential of each of the first through nth bit lines BL1 through BLn is raised to the power source voltage Vcc by the turn on of the transistors NU1 through NUm. Here, in case where all the memory cells MC in the memory cell array 3 keep the programmed state, the potentials of the first through nth bit lines BL1 through BLn all keep the power source voltage Vcc, and therefore, the transistors N1 through Nn of the pre-program verification circuit 2 are all turned on so that the signal of the ground potential state is output at the output terminal X. To the contrary, in case where all the memory cells in the memory cell array 3 keep the erase state, the potentials of the first through nth bit line BL1 through BLn all keep the ground potential state, and therefore, the transistors N1 through Nn of the pre-program verification circuit 2 are all turned off so that the signal of the power source voltage Vcc is output at the output terminal X. In the same way, in case where any one memory cell among all the memory cells in the memory cell array 3 keeps the erase state, the bit line in which the erased memory cell is present keeps the ground potential state, and therefore, one of the transistors N1 through Nn of the pre-program verification circuit 2 is turned off so that the signal of the power source voltage Vcc is output at the output terminal X. Therefore, the word line selection and latch circuit 1 which receives the verification signal so supplies the word line selection signal only to the word line in which there are memory cells which keeps the erase state, also a program circuit(not shown) which receives the verification signal so supplies a bias voltage which can program only the memory cells which keeps the erase state. In general, the program circuit has a program bias voltage source and a control circuit. The control circuit is, for example, driven by a control signal such as the verification signal and a program signal, whereby a bias voltage from the program bias voltage source of the program circuit is supplied to the memory cell.

Figure 3:
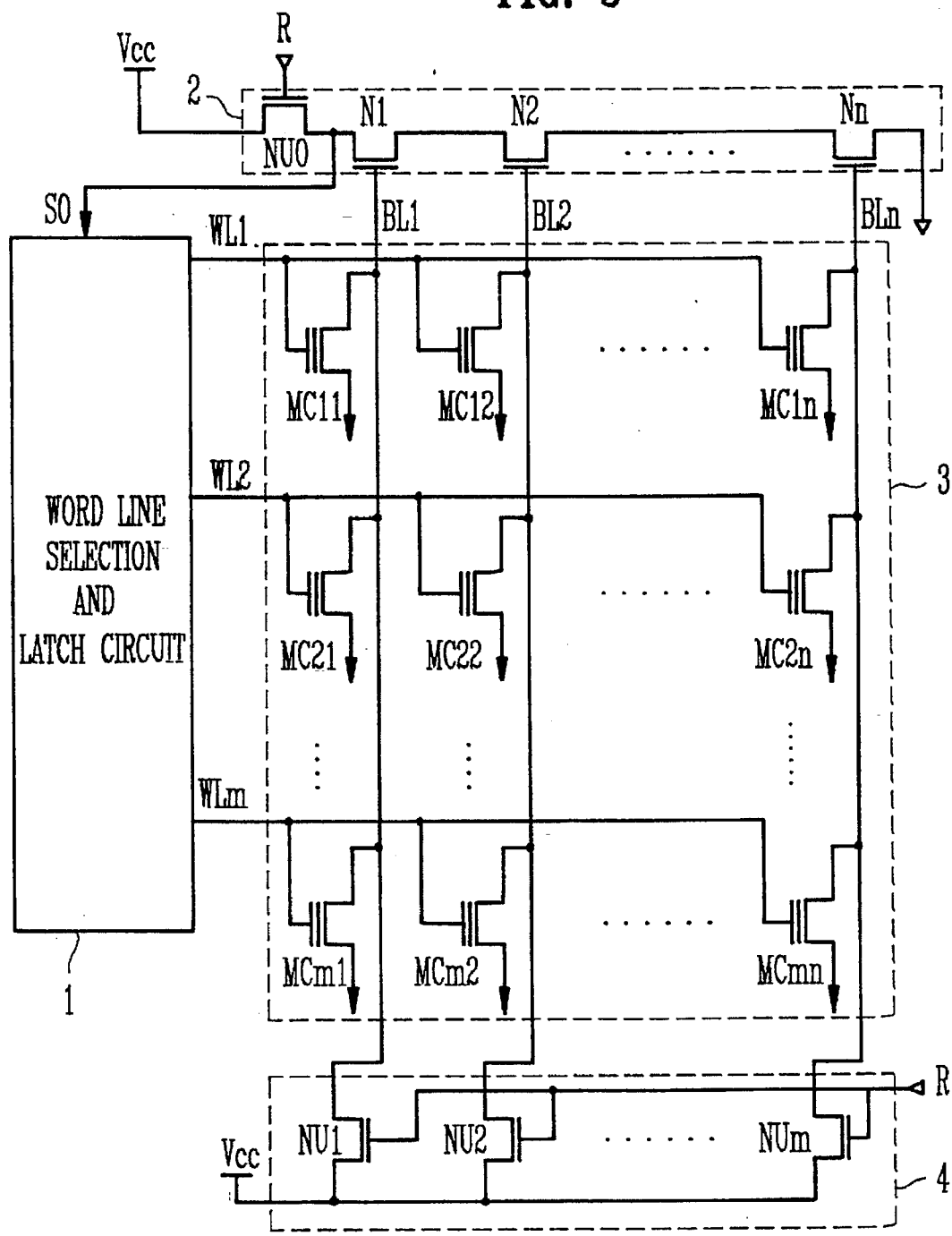
FIG. 3 is a circuit diagram to illustrate another embodiment of the pre-program verification circuit of FIG. 2.

In addition, the pre-program verification circuit 2 can be constructed differently as shown in FIG. 3.

The transistor NU0 operating according to the pre-program enable signal R is connected between the power source Vcc and the output terminal X to output the verification signal so, the transistors N1 through Nn operating according to the pre-program enable signal R are each connected in parallel between the output terminal X and the first through nth bit lines BL1 through BLn. Now, an explanation of the flash memory device having the pre-program verification circuit 2 constructed as described above is given below.

To verify whether the memory cells are programmed, the pre-program enable signal R of high potential state is input to the pre-program verification circuit 2 and the pre-program pull-up circuit 4, respectively. At this time, the word line selection and latch circuit 1 supplies a word line selection signal to each word line to be pre-programmed among the first through mth word lines WL1 through WLn.(Here, it is assumed that the word line selection signal is supplied to the first word line WL1.) By the pre-program enable signal R, the transistor NU0 and the transistors N1 through Nn of the pre-program verification circuit 2 are turned on and also the transistors NU1 through NUm of the pre-program pull-up circuit 4 are turned on. The potential of each of the first through nth bit lines BL1 through BLn is raised to the power source voltage Vcc by the turn on of the transistors NU1 through NUn. Here, in case where all the memory cells connected to the first word line WL1 keep the programmed state, the potentials of the first through nth bit lines BL1 thorough BLn all keep the power source voltage Vcc, and therefore, the signal of the power source voltage Vcc is output at the output terminal X. To the contrary, in case where all the memory cells connected to the first word line WL1 keep the erase state, the potentials of the first through nth bit line BL1 through BLn all keep the ground potential state, and therefore, the signal of the ground potential is output at the output terminal X, in the same way, even in case where any one memory cell among all the memory cells connected to the first word line WL1 keeps the erase state, the signal of ground potential is output at the output terminal X. Therefore, the word line selection and latch circuit 1 which receives the verification signal so supplies the word line selection signal only to the word line in which there are memory cells which keep the erase state, also a program circuit (not shown) which receives the verification signal so supplies a bias voltage which can program only the memory cells which keeps the erase state.

As described above, according to the present invention, the memory cell can be prevented from being over-programmed by verifying whether the memory cell is programmed before performing the pre-program operation and by pre-programming only the memory cells which keep the erase state. Therefore, there are excellent effects in that the reliability of the device can be improved, and the operation speed of the device can be improved by reducing the time required in the pre-program operation.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:
   a memory cell array in which a plurality of memory cells are connected in a matrix fashion between a first through mth word lines and a first through nth bit lines;
   a word line selection and latch circuit for outputting each word line selection signal to each of said first through mth word lines;
   a pre-program verification circuit which is connected to said first through nth bit lines and which outputs a verification signal to said word line selection circuit and a program circuit according to a pre-program enable signal; and a pre-program pull-up circuit which is connected to said first through nth bit lines and which raises each of the potentials of said first through nth bit lines according to said pre-program enable signal.

2. The flash memory device of claim 1, wherein said pre-program verification circuit comprises:

a transistor which is connected between a power source and an output terminal to output a verification signal and which operates according to said pre-program enable signal; and a plurality of transistors which are connected in series between said output terminal and a ground and each of which operates according to the state of each of said first through nth bit lines.

3. The flash memory device of claim 1, wherein said pre-program verification circuit comprises:

a transistor which is connected between a power source to output verification signal and an output terminal and which operates according to said pre-program enable signal; and a plurality of transistors each of which is connected in parallel between said output terminal and said first through nth bit lines and which operate according to said pre-program enable signal.

4. The flash memory device of claim 1, wherein said pre-program pull-up circuit comprises a plurality of transistors each of which is connected in parallel between a power source and said first through nth bit line, and which operate according to said pre-program enable signal.

* * * * *